(12) United States Patent
Jang

(10) Patent No.: US 7,939,404 B2
(45) Date of Patent: May 10, 2011

(54) MANUFACTURING METHOD OF CAPACITOR IN SEMICONDUCTOR

(75) Inventor: Chi Hwan Jang, Icheon-si (KR)

(73) Assignee: Hynix Semiconductor Inc, Icheon (KR)

( * ) Notice: Subject to any disclaimer, the term of this patent is extended or adjusted under 35 U.S.C. 154(b) by 0 days.

(21) Appl. No.: 12/648,199

(22) Filed: Dec. 28, 2009

(65) Prior Publication Data
US 2011/0003453 A1  Jan. 6, 2011

(30) Foreign Application Priority Data
Jul. 3, 2009 (KR) .................. 10-2009-0060711

(51) Int. Cl.
*H01L 21/8242* (2006.01)
(52) U.S. Cl. .................. 438/253; 438/396; 257/E21.648

(58) Field of Classification Search .................. 438/253, 438/254, 255, 387, 388, 396, 397; 257/E21.648
See application file for complete search history.

(56) References Cited

U.S. PATENT DOCUMENTS
2010/0187588 A1* 7/2010 Kim et al. .................. 257/306
* cited by examiner

*Primary Examiner* — Hoai v Pham

(57) ABSTRACT

A manufacturing method of a capacitor of a semiconductor device includes a first step of forming a graphene seed film over a substrate; a second step of increasing surface energy of the graphene seed film and performing a first plasma process to the graphene seed film; a third step of growing a graphene on the graphene seed film; a fourth step of growing a nano tube or a nano wire using the graphene as a mask; and a fifth step of sequentially forming a dielectric film and a conductive layer over the nano tube or the nano wire.

17 Claims, 6 Drawing Sheets

(a)

(b)

(a)

(b)

(a)

(b)

(a)

(b)

(a)

(b)

(a)

(b)

(a)

(b)

MANUFACTURING METHOD OF CAPACITOR IN SEMICONDUCTOR

CROSS-REFERENCE TO RELATED APPLICATION

The priority based on Korean patent application No. 10-2009-0060711 filed on Jul. 3, 2009, the disclosure of which is hereby incorporated in its entirety by reference, is claimed.

BACKGROUND OF THE INVENTION

The present invention relates to a semiconductor device, and more specifically, to a method of manufacturing a capacitor using a Carbon Nano Tube (CNT) as a storage node after growing the CNT by using a graphene as a mask.

Generally, semiconductor memory devices store information such as data or a program command.

In such a semiconductor device, a capacitor is used in each circuit of a peripheral circuit region and a cell region. The capacitor is generally constituted with a storage node, a cell plate and a dielectric thin film. In the case of the memory device which includes such a capacitor, it is very important to increase a capacitance of the capacitor.

For securing the capacitance of the capacitor conventionally, a gate oxide film is used as the dielectric thin film in the case of the capacitor used in the circuit, and a cylindrical structure is used in the case of the capacitor used in the cell region.

However, as an integration density of a Dynamic Random Access Memory (DRAM) device is increased to a giga-scale, a size of the capacitor is decreased. Accordingly, in the case of the capacitor used in each circuit, the capacitor can be destroyed due to a low capacitance causing a defect; also, in the case of the capacitor used in the cell region, there is a limit to extending the height of the capacitor.

Also, if the height of the capacitor is increased, manufacturing the capacitor in itself is difficult and there arise many problems in a following photolithography process or a metal process. Consequently, a size of the chip which includes the capacitor needs to be increased. Therefore, the height of the capacitor cannot be increased unlimitedly.

For overcoming the above-mentioned problems, a manufacturing method of the capacitor using a nano tube has been proposed.

However, according to a conventional manufacturing method of the capacitor using the nano tube, nano tubes cannot be vertically grown regularly and uniformly. This causes the nano tubes to get tangled during a growing process.

BRIEF SUMMARY OF THE INVENTION

The present invention has been proposed in order to manufacture a capacitor having a higher capacitance by regularly growing nano tubes by improving a manufacturing method of the capacitor using the nano tube.

In accordance with one embodiment of the present invention, there is provided a method for making a capacitor of a semiconductor device including forming a graphene seed film over a substrate; performing a first plasma process on the graphene seed; growing a graphene on the graphene seed film; growing a nano tube or a nano wire using the graphene as a mask; and sequentially forming a dielectric film and a conductive layer over the nano tube or the nano wire.

In this way, in accordance with the present invention, a capacitance efficiency can be improved by regularly and uniformly growing the nano tube or the nano wire by growing the nano tube or the nano wire using the graphene as a mask after growing the graphene before forming the nano tube or the nano wire.

In the manufacturing method of the capacitor of the semiconductor device, the graphene seed film can be formed with one of single-elements of transition metal material, nickel (Ni), iron (Fe), cobalt (Co), platinum (Pt) and palladium (Pd), and a combination thereof. At this time, such a graphene seed film can be formed over the substrate by using PVD, CVD, ALD, SPIN or SPRAY method.

In the manufacturing method of the capacitor of the semiconductor device, the first plasma process includes irradiating light having a shorter wavelength than ultraviolet light to the graphene seed film and causing non-volatile gaseous plasma to collide with the graphene seed film. And, the graphene can be grown by using a method of Chemical Vapor Deposition, electric furnace, Rapid Thermal Annealing (RTA), arc-discharge or laser vaporization in an atmosphere having a carbonization series gas at a temperature of at least 1000° C. It is grown to a height of at least 2 to 3 nm.

In the manufacturing method of the capacitor of the semiconductor device, the nano tube or the nano wire can be grown better by performing a second plasma process that increases surface energy of a region exposed by the graphene partly. And, the nano tube or the nano wire can be grown in a chamber by using a method of CVD, electric furnace, Rapid Thermal Annealing (RTA), arc-discharge or laser vaporization in an atmosphere including a carbonization series gas, a silicon series gas or a mixture thereof, and wherein the chamber is maintained at a temperature of 200 to 1000° C. and pressure of no more than 10 Torr while the nano tube or the nano wire is being grown in the chamber.

In the manufacturing method of the capacitor of the semiconductor device, a plate electrode can be formed through depositing a first conductive film over the dielectric film by using a method of ALD, CVD or MOCVD and depositing a second conductive film on the firstly deposited conductive film so that the nano tube or the nano wire can be buried.

DESCRIPTION OF EMBODIMENTS

Figure 1:
FIGS. 1 to 6 are sequential diagrams of a manufacturing process for explaining a manufacturing method of a capacitor of a semiconductor device in accordance with the present invention.
Figure 1:
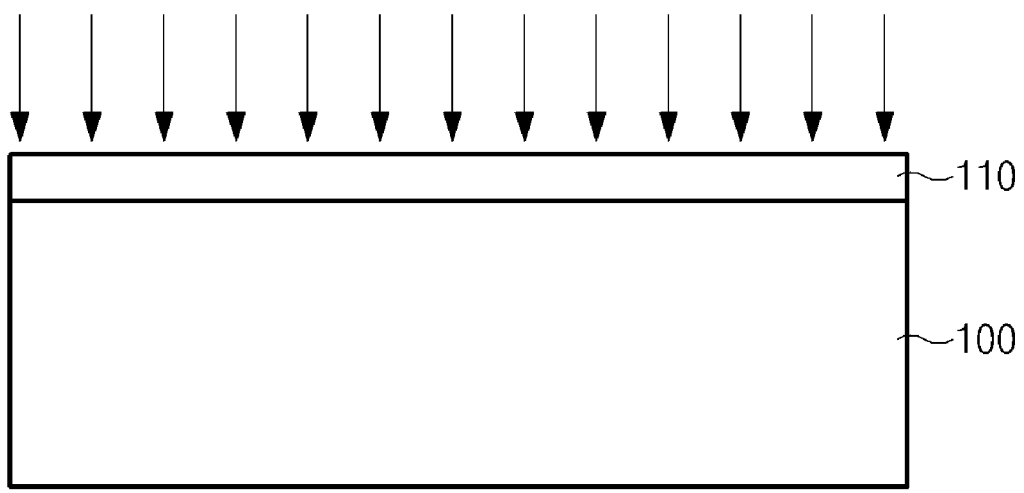
Figure 2:
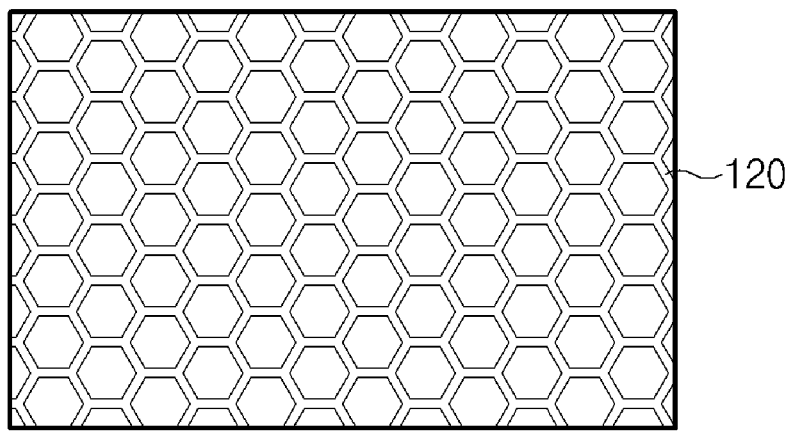
Figure 2:
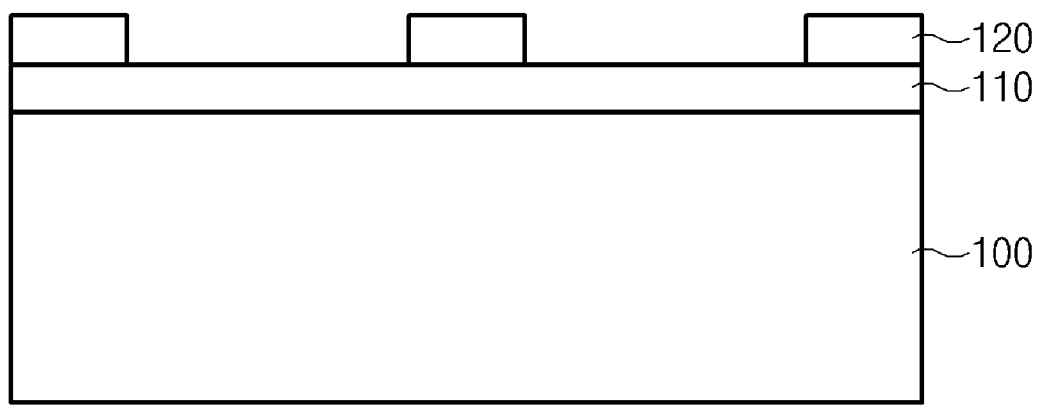
Figure 3:
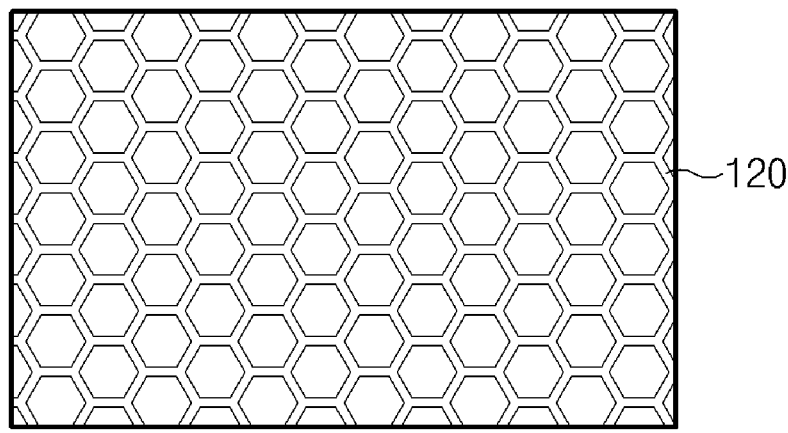
Figure 3:
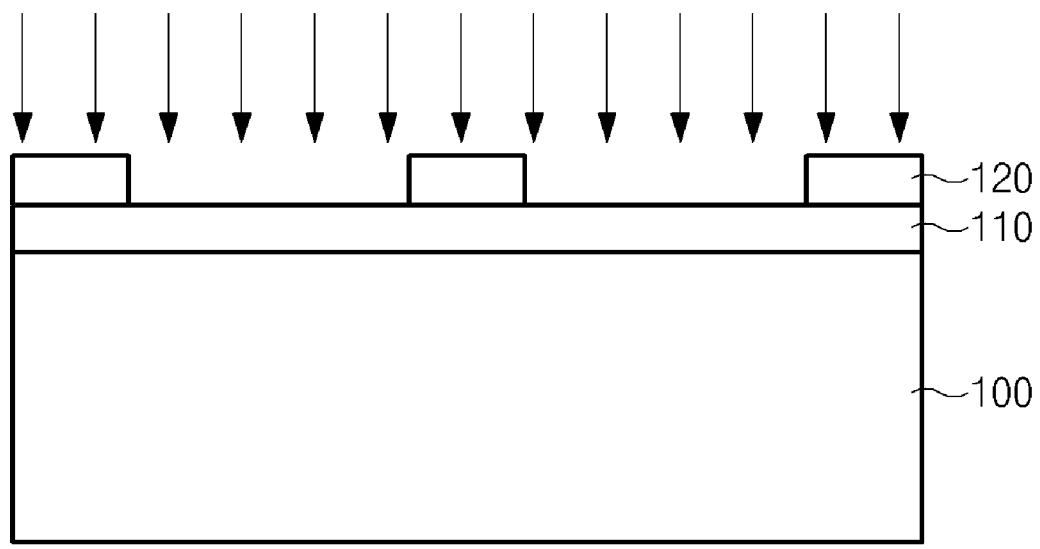
Figure 4:
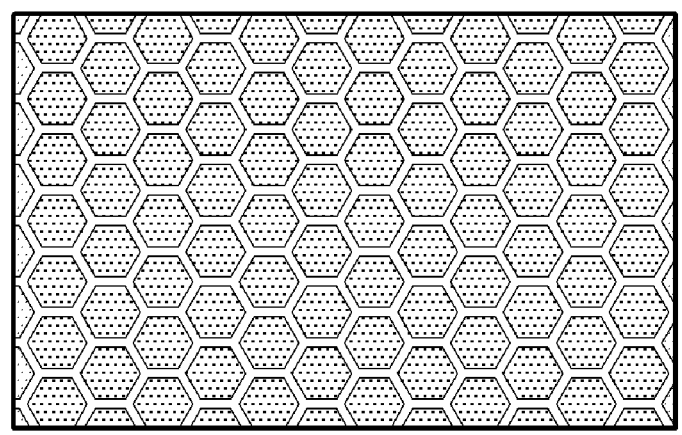
Figure 4:
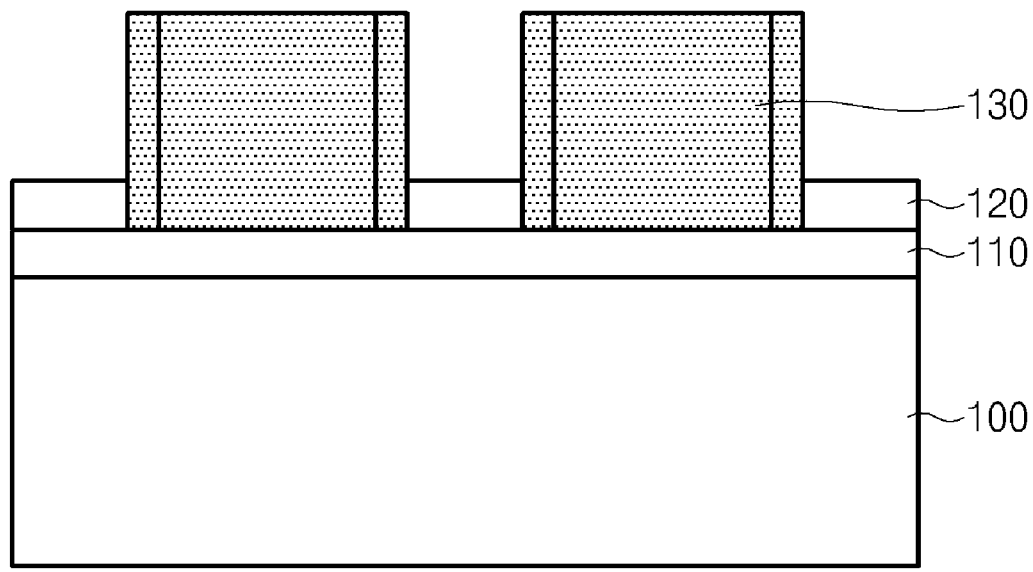
Figure 5:
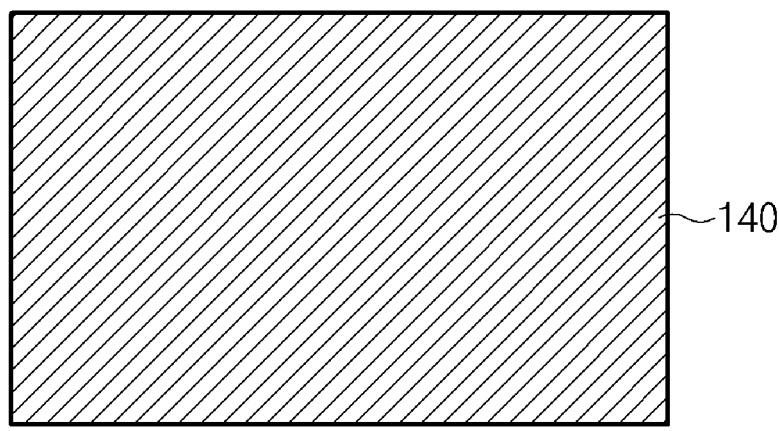
Figure 5:
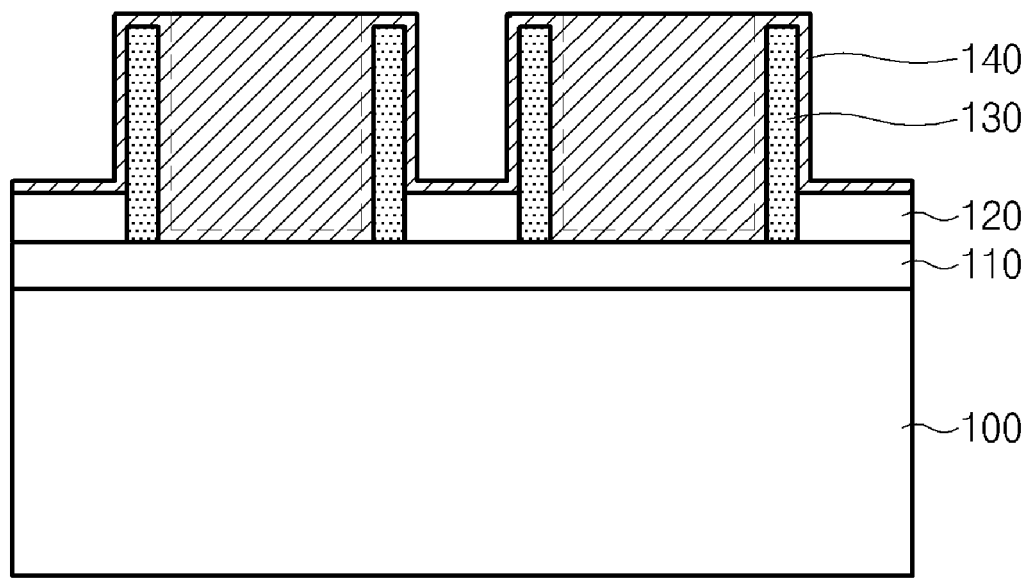
Figure 6:
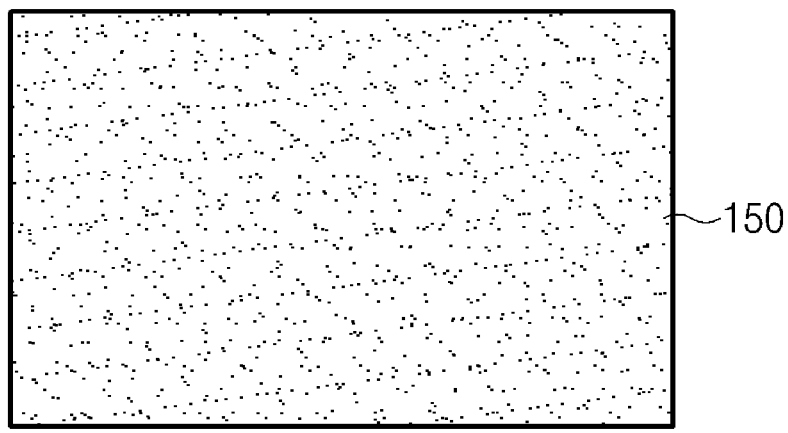
Figure 6:
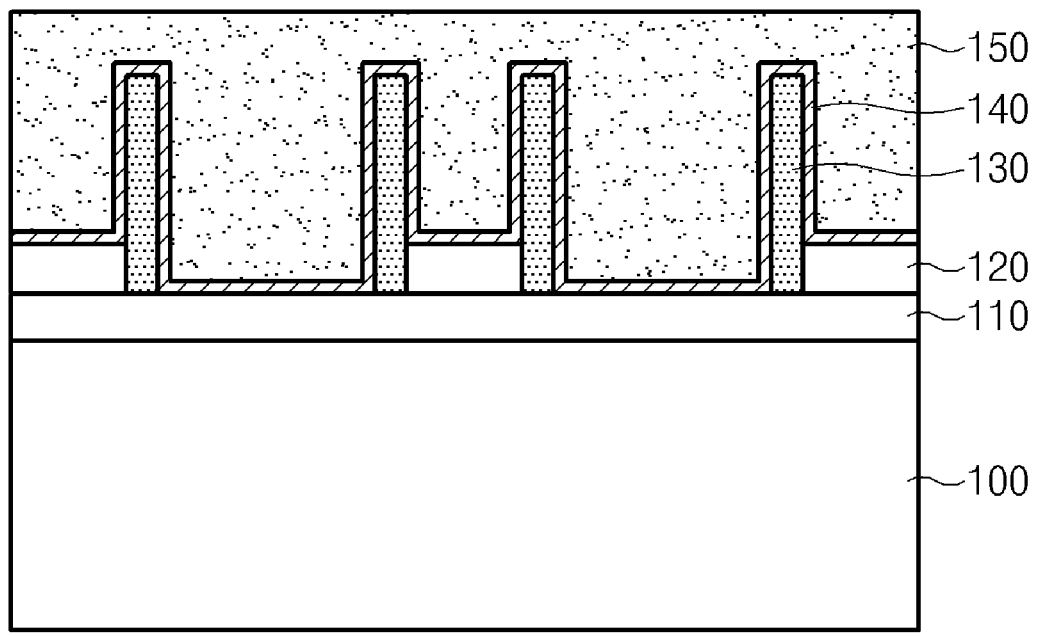

FIGS. 1 to 6 are sequential diagrams of a manufacturing process for explaining a manufacturing method of a capacitor of a semiconductor device in accordance with the present invention. Herein, FIGS. 1A to 6A are plan-views illustrating the manufacturing process and FIGS. 1B to 6B are cross-sectional views illustrating the manufacturing process.

Referring to FIGS. 1A and 1B, a graphene seed film 110 needed for growing a graphene is formed on a silicon substrate 100 by using PVD, CVD, ALD, SPIN or SPRAY method. The silicon substrate 100 also includes a lower structure. At this time, the lower structure may include a transistor and a landing plug contact connected to a conjunction region of the transistor in the case of a cell region. And, the graphene seed film 110 may be formed with one of single-elements of transition metal material, nickel (Ni), iron (Fe), cobalt (Co), platinum (Pt) and palladium (Pd) and alloys of these elements.

Next, after putting the substrate where the graphene seed film 110 is formed into a reactor (not shown), a first plasma process is performed by injecting non-volatile gaseous plasma into the reactor while irradiating the graphene seed film 110 using light (or laser) having a shorter wavelength than that of ultraviolet light. That is, at a state where surface energy of the graphene seed film 110 is increased by irradiating the graphene seed film 110 using the light or laser with the shorter wavelength than that of the ultraviolet light within the reactor, the plasma is made to collide with the surface of the graphene seed film 110 so that the surface of the graphene seed film 110 becomes unevenly rough. This process is performed for approximately 10 seconds to 10 minutes.

Referring to FIGS. 2A and 2B next, a graphene 120 is grown at the graphene seed film 110 by increasing temperature of the reactor (or process chamber) to 1000° C. or higher and using methods of Chemical Vapor Deposition, electric furnace, Rapid Thermal Annealing (RTA), arc-discharge, laser vaporization and the like in an atmosphere of saturated hydrocarbon and unsaturated hydrocarbon such as $CH_4$, $C_2H_6$ and $C_4F_8$, and a carbonization series gas including carbon except for aromatic hydrocarbon. FIG. 2B shows the sidewalls of the graphene 120. At this time, the graphene 120 is formed to have at least a sufficient height in order not to be severed at a following nano tube growing process. The graphene 120 is formed having a height of at least 2 to 3 nm.

Referring to FIGS. 3A and 3B next, a second plasma process is performed by irradiating light with a shorter wavelength than that of ultraviolet light onto the graphene 120.

If the second plasma process is performed by irradiating light over the resultant surface, the graphene 120 serves as a mask so that the plasma collides with only the exposed parts of the seed film 110. Accordingly, only surface energy of the exposed parts of the seed film 110 is locally increased.

Referring to FIGS. 4A and 4B, a carbon nano tube (CNT) 130 is grown to a height of about 1 to 1000 nm at the exposed part of the seed film by using the methods of CVD, electric furnace, RTA, arc-discharge, laser vaporization and the like. The carbon nano tube 130 is grown in a process chamber having a temperature ranging from 200 to 1000° C. in an atmosphere where saturated hydrocarbon and unsaturated hydrocarbon such as $CH_4$, $C_2H_6$ and $C_4F_8$, and a carbonization series gas including carbon except for aromatic hydrocarbon are injected into the process chamber, so that the chamber pressure is no more than 10 Torr. At this time, since the carbon nano tube 130 is grown only at the part exposed by the graphene 120, the carbon nano tube 130 is grown having regular spacing as shown in FIG. 4A.

If a silicon nano wire is grown instead of the carbon nano tube, the silicon nano wire can be grown by using the above-mentioned method using a silicon series gas which includes silicon (Si), e.g., $SiH_4$, $SiH_6$, $Si_4F_8$ and $CH_3SiCl_3$, as a source gas. And, in the case of growing a silicon carbon nano tube in which the silicon is mixed with the carbon, the silicon carbon nano tube can be grown by using the above-mentioned method using a gas in which the silicon series gas is mixed with the carbonization series gas as the source gas.

Referring to FIGS. 5A and 5B next, a dielectric film 140 is formed by thinly depositing dielectric material over a resultant material where the carbon nano tube 130 is grown by using an ALD, CVD or MOCVD method. During this deposition process, since dielectric materials are also deposited on an inner surface of the carbon nano tube 130, a deposited area is extended so that the capacitance of the capacitor can be increased. At this time, an oxide film series, a nitride film series, ONO or dielectric material having a high dielectric constant (high-K) can be used as the dielectric material.

Referring to FIGS. 6A and 6B next, a plate electrode 150 is formed on the dielectric film 140 by depositing conductive material. At this time, explaining the forming process of the plate electrode 150 in detail, after the conductive material is thinly deposited on the dielectric film 140 firstly by using the ALD, CVD or MOCVD method, the conductive material is secondly deposited again on the firstly deposited conductive material so that the carbon nano tube can be completely buried. With this, capacitance efficiency can be maximized. At this time, one of metal, silicate, silicide, poly silicon, Poly-SiGe, amorphous silicon, amorphous-SiGe and a mixture of these materials can be used as the conductive material used as the plate electrode 150.

While the present invention has been described with respect to the specific embodiments, it will be apparent to those skilled in the art that various changes and modifications may be made without departing from the spirit and scope of the invention as defined in the following claims.

For instance, the above-mentioned second plasma process is for facilitating the growth of the carbon nano tube 130 at the region exposed by the graphene 120 and can be omitted as necessary.

Also, since it is well-known to those skilled in the art that, in the case of forming the capacitor at the cell region or the peripheral circuit region, an accompanying process of selectively removing the graphene seed film 110 of a region where the capacitor is not formed by using photo lithography before forming the graphene 120, or an accompanying process of selectively removing the graphene seed film 110 and the graphene 120 of a region where the capacitor is not formed by using the photo lithography after forming the graphene 120 before growing the nano tube 130 is needed, detailed explanations about this are omitted.

What is claimed is:

1. A method for making a capacitor of a semiconductor device, the method comprising:
    forming a graphene seed film over a substrate;
    performing a first plasma process on the graphene seed;
    growing a graphene on the graphene seed film;
    growing a nano tube or a nano wire using the graphene as a mask; and
    sequentially forming a dielectric film and a conductive layer over the nano tube or the nano wire,
    wherein the nano tub or the nano wire, the dielectric film, and the conductive layer define the capacitor.

2. The method of claim 1, wherein the graphene seed film is formed over the substrate by using PVD, CVD, ALD, SPIN or SPRAY method.

3. The method of claim 1, wherein the graphene seed film is formed using one of single-elements of transition metal material, nickel (Ni), iron (Fe), cobalt (Co), platinum (Pt), palladium (Pd), and a combination thereof.

4. The method of claim 3, wherein the graphene seed film is formed over the substrate by using PVD, CVD, ALD, SPIN or SPRAY method.

5. The method of claim 1, wherein the first plasma process includes irradiating light having a shorter wavelength than ultraviolet light to the graphene seed film and causing non-volatile gaseous plasma to collide with the graphene seed film.

6. The method of claim 5, wherein the graphene is grown by using a method of Chemical Vapor Deposition, electric furnace, Rapid Thermal Annealing (RTA), arc-discharge or laser vaporization in an atmosphere having a carbonization series gas at a temperature of at least 1000° C.

7. The method of claim 6, wherein the graphene is grown to a height of at least 2 to 3 nm.

8. The method of claim 1, wherein the nano tube or the nano wire is grown in a chamber by using a method of CVD, electric furnace, Rapid Thermal Annealing (RTA), arc-discharge or laser vaporization in an atmosphere including a carbonization series gas, a silicon series gas or a mixture thereof, and wherein the chamber is maintained at a temperature of 200 to 1000° C. and pressure of no more than 10 Torr while the nano tube or the nano wire is being grown in the chamber.

9. The method of claim 8, wherein the nano tube or the nano wire is grown to a height of 1 to 1000 nm.

10. The method of claim 8, wherein the nano tube is grown in an atmosphere where CH4, C2H6 and C4F8 are injected into the chamber.

11. The method of claim 10, wherein the nano tube or the nano wire is grown in a chamber by using a method of CVD, electric furnace, Rapid Thermal Annealing (RTA), arc-discharge or laser vaporization in an atmosphere including a carbonization series gas, a silicon series gas or a mixture thereof, and wherein the chamber is maintained at a temperature of 200 to 1000° C. and pressure of no more than 10 Torr while the nano tube or the nano wire is being grown in the chamber.

12. The method of claim 8, wherein the nano wire is grown in an atmosphere where SiH4, SiH6 Si4F8 and CH3SiCl3.

13. The method of claim 12, wherein the nano tube or the nano wire is grown to a height of 1 to 1000 nm.

14. The method of claim 13, wherein the graphene defines a plurality of areas separated from each other, where the nano structure is grown on each area defined by the graphene so that adjacent nano structures are separated from each other.

15. The method of claim 1, wherein growing the nano tube or the nano wire includes performing a second plasma process that increases surface energy of a region exposed by the graphene partly.

16. The method of claim 1, wherein forming the conductive layer includes:

depositing a first conductive film over the dielectric film by using a method of ALD, CVD or MOCVD; and depositing a second conductive film on the first conductive film so that the nano tube or the nano wire can be buried.

17. A method for making a capacitor of a semiconductor device, the method comprising:

forming a seed film over a substrate;

performing a first plasma process on the seed film to grow a graphene on the seed film;

performing a second plasma process on the seed film using the graphene as a mask in order to grow a nano structure; and forming a dielectric film over the nano structure grown;

forming a conductive layer over the dielectric film, wherein the nano structure, the dielectric film, and the conductive layer define the capacitor.

* * * * *